United States Patent [19]

Onishi

[11] Patent Number: 5,309,625
[45] Date of Patent: May 10, 1994

[54] CARD TYPE FUSE AND METHOD OF PRODUCING THE SAME

[75] Inventor: Yasuhiko Onishi, Yokkaichi, Japan

[73] Assignee: Sumitomo Wiring Systems, Ltd., Japan

[21] Appl. No.: 71,689

[22] Filed: Jun. 3, 1993

[30] Foreign Application Priority Data

Jul. 16, 1992 [JP] Japan .................. 4-213387

[51] Int. Cl.$^5$ .................. H01H 69/02; H01H 85/04
[52] U.S. Cl. .................. 29/623; 337/297
[58] Field of Search .................. 337/297; 29/623

[56] References Cited

U.S. PATENT DOCUMENTS 5,166,656  11/1992  Badihi et al. .................. 337/297

FOREIGN PATENT DOCUMENTS 2151626  4/1973  Fed. Rep. of Germany .
270954   6/1988  Eur. Pat. Off. .
16004    9/1992  World Int. Prop. Org. .

*Primary Examiner*—Harold Broome
*Attorney, Agent, or Firm*—Jordan B. Bierman

[57] ABSTRACT

A card type fuse aimed at reducing production costs and improving a forming precision of an exothermic fusing portion 2a. The card type fuse comprises an insulation substratum 1, fuse circuits 2 arranged on the insulation substratum 1 and having a narrow exothermic fusing portion 2a, and a cover layer 3 covering fuse circuits 2. The cover layer 3 is made of a heat resisting film. The fuse circuits 2 are printed on the heat resisting film by means of a conductive paste. The insulation substratum 1 is made of a heat resisting thermoplastic resin suitable for an SMT. The insulation substratum 1 is integrally formed on the side having the fuse circuits on the heat resisting film.

11 Claims, 2 Drawing Sheets

CARD TYPE FUSE AND METHOD OF PRODUCING THE SAME

BACKGROUND OF THE INVENTION

1. Field of the Invention

This invention relates to a card type fuse in which fuse circuits are arranged on an insulation substratum and in which a cover layer covers the fuse circuits, and a method of producing the same.

2. Statement of the Prior Art

A card type fuse is suitable for use in various devices having a low electrical power of less than 1A. For example, such a fuse is suitable for fuse-matching in a wire harness composed of wires having a small diameter, and which connects, for example, a series of electronic elements in a car. In such fields, utilization of card type fuses has been increasing.

For instance, in a harness for a motor car, a card type fuse is employable with reduced diameter wires and has an advantage in that it has a small capacity. Electronic elements in cars are required to connect various kinds of devices and include a number of small capacity fuses. As such, card type fuses are advantageous since they can arrange many small capacity fuses.

Ease of connection to a wiring harness has promoted the use of card type fuse-equipped connectors or the like. Such a connector is located not only in special fuse boxes but also in various kinds of devices. The connector is suitable for use with a multiple connections having a small size, thus enabling a car to be provided with numerous electronic devices.

In addition, heretofore, a low melting point metal (lead, zinc, lead-tin alloy) or a high melting point metal (silver, copper) has been used as a fuse element. However, use of a low melting point metal makes it difficult to produce a fuse having a small diameter. On the other hand, use of a high melting point metal is inappropriate in that a melting point higher than that required is provided. Such a high melting point metal can not release a circuit upon over-heating and thus makes it difficult to produce a low power circuit. In view of the above, the card type fuse is the most suitable for use in a small sized fuse circuit carrying a low current.

In Japanese Patent Publication No. 59-42479 (1984), a card type fuse is disclosed which is produced by the steps of: forming a fuse circuit on a substratum (e.g., copper-glass epoxy substratum) for a circuit sold in a market through a stainless mask in an exposuring manner; vaporizing the low melting point metal such as tin and the like on the fuse circuit; and coating the fuse circuit with a heat resisting film such as polyester (PET), polyimide (PI) or the like by using an adhesive.

However, manufacture of the above card type fuse is both time and cost inefficient and makes it difficult to precisely design an exothermic fusing portion.

SUMMARY OF THE INVENTION

An object of the present invention is to provide a card type fuse which enjoys reduced production costs and exhibits improved forming characteristics for an exothermic fusing portion.

Another object of the present invention is to provide a method for producing a card type fuse which enjoys reduced production costs and exhibits improved forming characteristics for an exothermic fusing portion.

To achieve the first object, in accordance with the present invention, a card type fuse in which fuse circuits having a narrow exothermic fusing portion are arranged on an insulation substratum and a cover layer is provided over the fuse circuits, comprising:
a cover layer made of a heat resisting film;
fuse circuits printed on said heat resisting film by a conductive paste; and
an insulation substratum made of a heat resisting thermoplastic resin usable for a surface amount technology (hereinafter referred to as "SMT") and formed integrally on the side having the printed fuse circuit on said heat resisting film.

To achieve the second object in accordance with the present invention, a method for producing a card type fuse in which fuse circuits having a narrow exothermic fusing portion are arranged on an insulation substratum and a cover layer is provided over the fuse circuits, comprising the steps of:
inserting a heat resisting film on which said fuse circuits are printed by means of a conductive paste in a metal forming mold;
supplying into said metal forming mold a heat resisting thermoplastic resin suitable for the SMT; and
forming integrally a cover layer including said fuse circuits and said heat resisting film on an insulation substratum made of said heat resisting thermoplastic resin suitable for the SMT.

According to the card type fuse of the present invention, it is possible to improve accuracy in forming the fuse circuits and exothermic fusing portion, since the fuse circuits are formed by being printed with a conductive paste.

Since the insulation substratum made of the heat resisting thermoplastic resin is usable for the SMT formed integrally on the side having the printed fuse circuits on the heat resisting film, it is not necessary to provide an additional covering layer, and the heat resisting film serves as a covering layer. Consequently, the number of production steps is reduced and production costs are accordingly lowered.

DETAILED DESCRIPTION OF THE PREFERRED EMBODIMENTS

Figure 1:
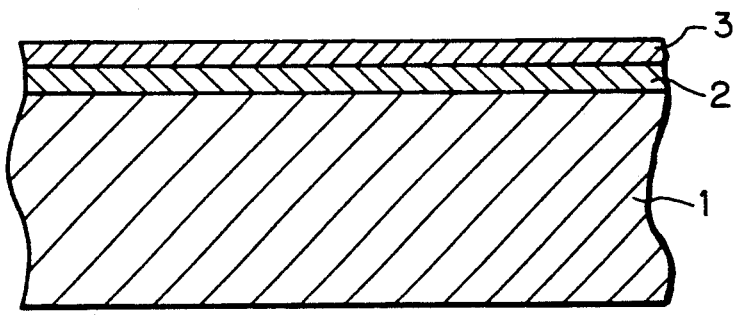
FIG. 1 is an enlarged cross sectional view of a main part of an embodiment of a card type fuse in accordance with the present invention.

Referring now to the drawings, an embodiment of a card type fuse of the present invention will be explained below. FIG. 1 shows an enlarged cross sectional view of the card type fuse formed on a print substratum and FIG. 2 shows a plan view of a main part of the card type fuse.

Figure 2:
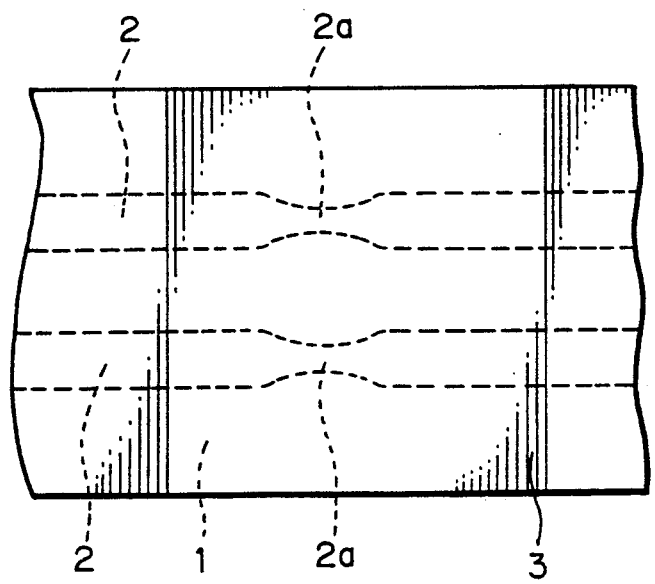
FIG. 2 is a plan view of the embodiment in FIG. 1.

In FIGS. 1 and 2, an insulation substratum 1 is formed by cutting into a desired shape a heat resisting thermoplastic resin suitable for the SMT which is suitable for heat-forming, such as polyether-etherketone (PEEK), thermoplastic polyimide (PI), polyphenylene sulfide (PPS), polyamide, polyetherimide, polyarylate, liquid crystal polymer, polyester (PET, PBT), polyamide (nylon 6, 66, 46, MXD6), or the like.

These heat resisting thermoplastic resins may be selected from one of materials from non-reinforced materials to filler-reinforced materials and preferably are glass-reinforced material containing 20 to 40% of glass.

Fuse circuits 2 are integrally formed and transferred on one side of the insulation substratum 1 and each of the fuse circuits has a narrow exothermic fusing portion 2a. When an over current flows in the fuse circuits 2, the exothermic fusing portions 2a are fused at a temperature over their melting point and cut off, thereby turning off the circuits 2.

The fuse circuits 2 are formed by screen-printing or silk-printing the conductive paste on one side of the heat resisting film to be a covering layer 3.

The conductive paste may be a low melting point metal such as lead, zinc lead-tin alloy, and the like, a high melting point metal such as silver, copper and the like, or a low melting point binary eutectic alloy or a low melting point multisystem eutectic alloy, which are combined by the low and high melting point metals.

The heat resisting film which forms the covering layer 3 may be a polyester film, a polyimide film, a polyamideimide film, an epoxy film, or the like, which have heat resisting characteristics.

The covering layer 3 is adhered to the insulation substratum upon molding.

Figure 3:
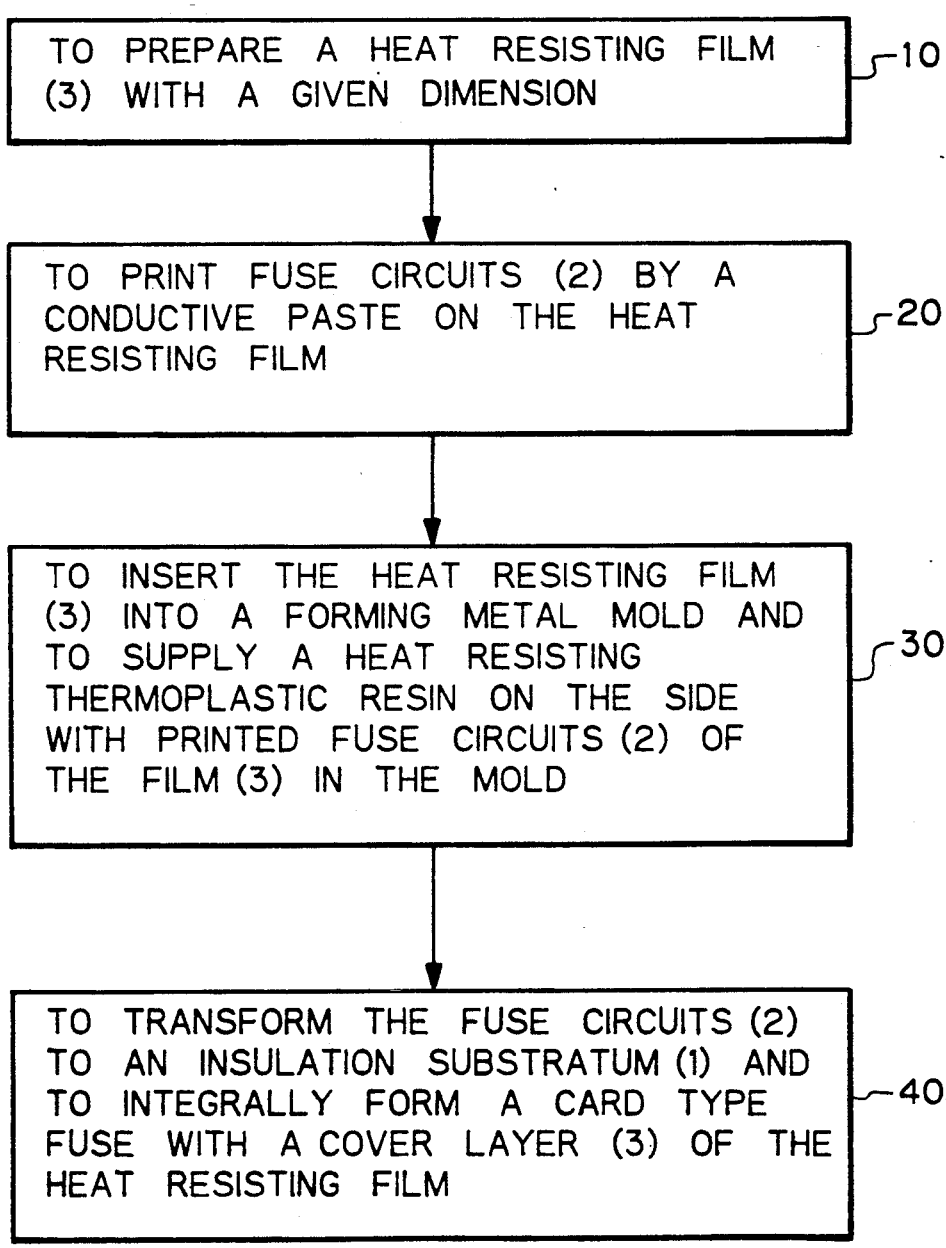
FIG. 3 is a flow chart illustrating a method of producing the card type fuse of the present invention.

FIG. 3 shows a flow chart of a method of producing the card type fuse. A heat resisting film made of the PET film or the like and having a given dimension is prepared beforehand (10). The fuse circuits 2 are formed on one side of the heat resisting film by screen-printing or silk-printing of the conductive paste (20).

The heat resisting film with printed fuse circuits 2 is inserted into a forming metal mold and a heat resisting thermoplastic resin suitable for the SMT such as PPS or the like is supplied in the mold on the side with the fuse circuits 2 to integrally form the card type fuse (30).

Thus, the card type fuse is integrally formed and the fuse circuits 2 are transferred on the insulation substratum 1 made of the heat resisting thermoplastic resin suitable to the SMT and the heat resisting film serves as the covering layer 3 for the fuse circuits 2 (40).

As described above, according to the card type fuse and the method of producing the same in the embodiment of the present invention, since the fuse circuits 2 are printed on the heat resisting film by means of the conductive paste, the fuse circuits 2 are accurately formed on the film, so that the exothermic fusing portions 2a are also accurately formed.

Now, in screen-printing with the conductive paste, a printed line with a width of less than 0.3 mm is sufficient for practical use. The printed line has a precision of about ±50 μm in width and a maximum thickness of 10 μm. This can be fully applied to a fuse.

Also, since the insulation substratum 1 is integrally formed on the side with the fuse circuits 2 on the heat resisting film, it is possible to utilize the heat resisting film as the covering layer 3 without providing it with another covering layer by using an adhesive or the like. Consequently, it is possible to reduce the number of producing steps and associated costs.

A method for integrally forming a heat resisting thermoplastic resin suitable for the SMT may be a projecting mold method, a flow stamping method, an NC blow method, an SP mold method, a heat-press method or the like, which can insert the heat resisting film with the fuse circuits 2 into the forming metal mold.

The forming metal mold may have a shape suitable for receiving the heat resisting film. The card type fuse may be of any convenient shape.

For example, the card type fuse may be formed by using PPS with a glass fiber content of 40% as the heat resisting thermoplastic resin suitable for the SMT, and using a projection molding device having a clamping force of 60 tons; inserting the PET film with the fuse circuits 2 printed with the conducting solder paste beforehand into the forming metal mold; and projecting the PPS into the mold by the device under conditions in which a temperature at the top of a nozzle of a projection cylinder is 320° C., a projection pressure is 800 kg/cm$^2$, and a temperature in the metal mold is 110° C.

It will be apparent from the foregoing that forming accuracies of the fuse circuits and exothermic fusing portions are improved since the fuse circuits are formed by printing with the conductive paste in the present invention. It is possible to reduce the number of production steps and costs since the insulation substratum made of the heat resisting thermoplastic resin suitable for the SMT are integrally formed on the side having the fused circuits printed on the heat resisting film.

What is claimed is:

1. A method for the production of a card-type fuse comprising at least one fuse circuit on an insulation substrate, said method comprising
    depositing said fuse circuit on a heat resistant film, inserting said heat resistant film into a mold, introducing a heat resistant thermoplastic resin into said mold and in contact with said film and said fuse circuit, and permitting said thermoplastic resin to set, whereby said heat resistant film, said fuse circuit, and said resin are fused together and said film forms a protective cover for said fuse circuit.

2. The method of claim 1 wherein said thermoplastic resin is selected from the group consisting of polyetherether ketones, polyimides, polyphenylene sulfides, polyamides, polyetheramides, polyarylates, liquid crystal polymers, polyesters, polyamides, and mixtures thereof.

3. The method of claim 2 wherein said polyester is selected from the group consisting of polyethylene terephthalate, polybutylene terephthalate, nylon 6, nylon 66, nylon 46, MXD 6, and mixtures thereof.

4. The method of claim 1 wherein said fuse circuit is deposited on said heat resistant film by silk screening.

5. The method of claim 1 wherein said fuse circuit is formed of a conductive paste.

6. The method of claim 5 wherein said paste comprises a substance selected from the group consisting of lead, zinc/lead/tin alloys, silver, copper, low melting point binary eutectic alloys, low melting point multisystem eutectic alloys, said binary alloys and said multisystem alloys being combinations of low melting point metals and high melting point metals.

7. The method of claim 1 wherein said heat resistant film contains a reinforcing material.

8. The method of claim 7 wherein said reinforcing material is glass fibers.

9. The method of claim 8 wherein there is 20% to 40% of said glass in said film.

10. The method of claim 1 wherein said heat resistant film, said fuse circuit, and said substrate are fused under pressure.

11. The method of claim 10 wherein said pressure is at least 60 tons.

* * * * *